US012740265B2

(12) United States Patent
Tang et al.

(10) Patent No.: US 12,740,265 B2
(45) Date of Patent: Sep. 15, 2026

(54) DISPLAY PANEL AND METHOD FOR FABRICATING THE SAME

(71) Applicant: HKC CORPORATION LIMITED, Shenzhen (CN)

(72) Inventors: Yangling Tang, Shenzhen (CN); Xiufeng Zhou, Shenzhen (CN); Baohong Kang, Shenzhen (CN)

(73) Assignee: HKC Corporation Limited, Shenzhen (CN)

( * ) Notice: Subject to any disclaimer, the term of this patent is extended or adjusted under 35 U.S.C. 154(b) by 425 days.

(21) Appl. No.: 18/352,513

(22) Filed: Jul. 14, 2023

(65) Prior Publication Data

US 2024/0334764 A1 Oct. 3, 2024

(30) Foreign Application Priority Data

Mar. 31, 2023 (CN) ........................ 202310333509.7

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/122* (2023.02); *H10K 59/40* (2023.02)

(58) Field of Classification Search
CPC .. H10K 59/131; H10K 59/1201; H10K 59/40; H10K 59/122
(Continued)

(56) References Cited

U.S. PATENT DOCUMENTS

2018/0175311 A1* 6/2018 Jin ........................ H10K 77/111
2018/0232086 A1 8/2018 Zhang et al.
(Continued)

FOREIGN PATENT DOCUMENTS

CN 105487718 A 4/2016
CN 107678597 A 2/2018
(Continued)

OTHER PUBLICATIONS

Machine English Translation of CN 115000138 (Year: 2022).*
(Continued)

*Primary Examiner* — Dzung Tran
(74) *Attorney, Agent, or Firm* — Maier & Maier, PLLC

(57) ABSTRACT

A display panel including, from bottom to top: a substrate, a drive layer, an anode layer, a luminescent layer, a cathode layer, a first inorganic encapsulation layer, an organic buffer layer, and a second inorganic encapsulation layer. A pixel defining layer is arranged between adjacent anode units. A metal layer is arranged between the pixel defining layer and the second inorganic encapsulation layer, and forms first signal lines and second signal lines. Each first signal line includes first sensing regions arranged at intervals, each second signal line includes second sensing regions arranged at intervals, and metal lines in each first sensing region and each second sensing region are interconnected to form a first sensing electrode and a second sensing electrode, respectively. Adjacent first sensing electrodes on each first signal line are interconnected, and adjacent second sensing electrodes on each second signal line are bridged through another metal layer.

18 Claims, 8 Drawing Sheets

(51) Int. Cl.
*H10K 59/122* (2023.01)
*H10K 59/40* (2023.01)

(58) Field of Classification Search
USPC ........................................................ 257/91
See application file for complete search history.

(56) References Cited

U.S. PATENT DOCUMENTS

| | | | | |
|---|---|---|---|---|
| 2018/0348926 | A1 | 12/2018 | Su | |
| 2020/0201483 | A1* | 6/2020 | Feng | G06F 3/0445 |
| 2020/0381486 | A1* | 12/2020 | Jeong | G06F 3/0446 |

FOREIGN PATENT DOCUMENTS

| | | | |
|---|---|---|---|
| CN | 109671747 | A | 4/2019 |
| CN | 110620118 | A | 12/2019 |
| CN | 111261799 | A | 6/2020 |
| CN | 111564482 | A | 8/2020 |
| CN | 111653521 | A | 9/2020 |
| CN | 113206038 | A | 8/2021 |
| CN | 115000138 | A | 9/2022 |
| CN | 116056510 | A | 5/2023 |
| KR | 1020160083624 | A | 7/2016 |

OTHER PUBLICATIONS

International Search Report issued on Dec. 21, 2023, in corresponding International Application No. PCT/CN2023/098108, 6 pages.

* cited by examiner

DISPLAY PANEL AND METHOD FOR FABRICATING THE SAME

CROSS-REFERENCE TO RELATED APPLICATIONS

Pursuant to 35 U.S.C. § 119 and the Paris Convention, this application claims the benefit of Chinese Patent Application No. 202310333509.7 filed Mar. 31, 2023, the contents of which are incorporated herein by reference.

TECHNICAL FIELD

The present application relates to the technical field of touch display, and more particularly to a display panel and a method for fabricating the same.

BACKGROUND

Display panels based on light emitting devices, such as organic light emitting diodes (OLED), are more and more widely used in products including computers and mobile phones, due to the characteristics of thinness and light weight, energy saving, broad viewing angle, wide color gamut, and high contrast.

At present, OLED-based touch products usually adopt an external touch structure, in which, a touch panel (TP) structure is fabricated above an OLED display panel. Such TP structure includes: an insulating layer, a first metal layer, an isolation layer, a second metal layer, and an organic layer; and the fabricating process of such TP structure requires at least three masking operations, resulting in expensive production cost.

SUMMARY

In view of the above-described problems, it is an objective of the present application to provide a display panel and a method for fabricating the same, so as to reduce the number of masking operations in the fabrication process of the TP structure and reduce the production cost.

In order to achieve the above objective, in a first aspect, embodiments of the present application provide a display panel, including, from bottom to top: a substrate, a drive layer, an anode layer, a luminescent layer, a cathode layer, a first inorganic encapsulation layer, an organic buffer layer, and a second inorganic encapsulation layer.

The anode layer comprises a plurality of anode units arranged at intervals, a pixel defining layer is arranged between adjacent anode units.

A metal layer is arranged between the pixel defining layer and the second inorganic encapsulation layer, and a plurality of first signal lines extending along a first direction and a plurality of second signal lines extending along a second direction are formed on the metal layer. Each of the plurality of first signal lines comprises a plurality of first sensing regions arranged at intervals, and metal lines in each of the plurality of the first sensing regions are interconnected to form a first sensing electrode. Each of the plurality of second signal lines comprises a plurality of second sensing regions arranged at intervals, and metal lines in each of the plurality of second sensing regions are interconnected to form a second sensing electrode.

Adjacent first sensing electrodes on each of the plurality of first signal lines are interconnected, and adjacent second sensing electrodes on each of the plurality of second signal lines are bridged through another metal layer.

As an optional implementation manner of an embodiment of the present application, a conductive layer is arranged on the pixel defining layer. The conductive layer comprises a plurality of conductive units, and on each of the plurality of conductive units is disposed an eave layer. The metal layer comprises the conductive layer.

As an optional implementation manner of an embodiment of the present application, adjacent second sensing electrodes on each of the plurality of second signal lines are bridged with a metal layer arranged beneath the pixel defining layer through via holes formed in the pixel defining layer.

As an optional implementation manner of an embodiment of the present application, adjacent second sensing electrodes on each of the plurality of second signal lines are bridged with corresponding anode units through via holes formed in the pixel defining layer.

As an optional implementation manner of an embodiment of the present application, the display panel further includes a first metal layer arranged on the organic buffer layer. Adjacent second sensing electrodes on each of the plurality of second signal lines are bridged with the first metal layer through via holes formed in the organic buffer layer and the eave layer.

As an optional implementation manner of an embodiment of the present application, the conductive layer comprises a plurality of conductive units, and on each of the plurality of conductive units is disposed an eave layer.

The metal layer comprise a first metal layer arranged above the organic buffer layer, and adjacent second sensing electrodes on each of the plurality of second signal lines are bridged with corresponding conductive units through via holes formed in the organic buffer layer and the eave layer.

As an optional implementation manner of an embodiment of the present application, the plurality of first signal lines and the plurality of second signal lines are crossed to form a reticulate structure.

In a second aspect, embodiments of the present application provide a method for fabricating a display panel. The method is used to form the display panel according to the first aspect or according to any embodiment of the first aspect. The method comprises:

- forming the drive layer on the substrate;
- forming an anode layer on the drive layer, in which, the anode layer comprises a plurality of anode units arranged at intervals;
- forming the pixel defining layer between adjacent anode units, forming the plurality of conductive units on the pixel defining layer, and forming an eave layer on each of the plurality of the conductive unit;
- forming the luminescent layer on surfaces of the anode layer and the pixel defining layer, and forming the cathode layer on the luminescent layer;
- forming the first inorganic encapsulation layer on surfaces of the cathode layer, the plurality of conductive units, and the eave layer; and
- forming the organic buffer layer above the first inorganic encapsulation layer, and forming the second inorganic encapsulation layer above the organic buffer layer.

As an optional implementation manner of an embodiment of the present application, after forming the pixel defining layer between the adjacent anode units and before forming the eave layer each of the plurality of conductive units, the method further comprises:

- forming via holes in the pixel defining layer, to enable the conductive units to bridge with the corresponding anode units through the via holes.

As an optional implementation manner of an embodiment of the present application, after forming the organic buffer layer above the first inorganic encapsulation layer and before forming the second inorganic encapsulation layer above the organic buffer layer, the further comprises:

forming via holes in the organic buffer layer and the eave layer, forming the first metal layer above the organic buffer layer, and bridging the conductive units with the first metal layer through the via holes.

The technical solution provided by the embodiment of the present application includes, from bottom to top: the substrate, the drive layer, the anode layer, the luminescent layer, the cathode layer, the first inorganic encapsulation layer, the organic buffer layer, and the second inorganic encapsulation layer arranged from bottom to top. The anode layer includes the plurality of anode units arranged at intervals. the pixel defining layer is arranged between adjacent anode units. The metal layer is arranged between the pixel defining layer and the second inorganic encapsulation layer. The metal layer forms the plurality of first signal lines extending along the first direction and the plurality of second signal lines extending along the second direction. Each of the plurality of first signal lines includes the plurality of first sensing regions arranged at intervals; and metal lines in each of the plurality of first sensing regions are interconnected to form the first sensing electrode. Each of the plurality of second signal lines includes the plurality of second sensing regions arranged at intervals; and metal lines in each of the plurality of second sensing regions are interconnected to form the second sensing electrode. Adjacent first sensing electrodes on each of the plurality of first signal lines are interconnected, and adjacent second sensing electrodes on each of the plurality of second signal lines are bridged through another metal layer. In the above technical solution, by reusing the metal layers in the display panel (the metal layer between the pixel defining layer and the second inorganic encapsulation layer may be reused, and other metal layers may also be reused), the fabrication of the TP structure of the display panel is achieved. In this way, the masking operation corresponding to the reused metal layer can be reduced during the fabrication of the TP structure, thereby reducing the production cost.

DETAILED DESCRIPTION OF THE EMBODIMENTS

Embodiments of the present application are described below with reference to the drawings in the embodiments of the present application. Terms used in the implementation of the embodiments of the present application are only used to explain the specific embodiments of the present application, and are not intended to limit the present application. The following specific embodiments may be combined with each other, and the same or similar concepts or processes may not be repeated in some embodiments.

Figure 1:
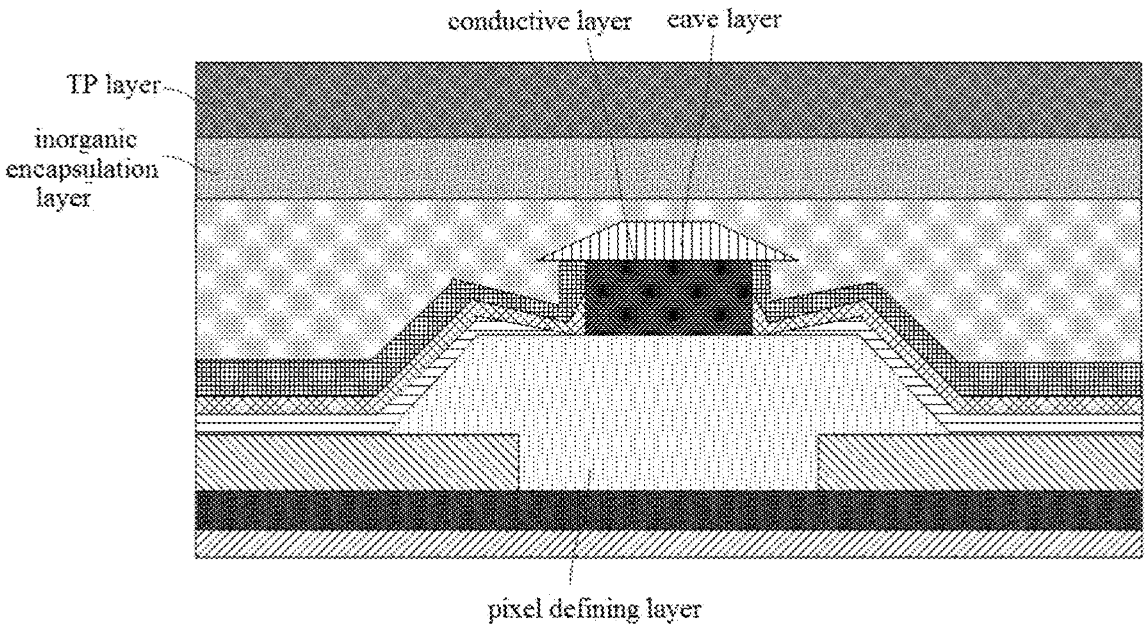
FIG. 1 is a schematic structural diagram of a display panel in an exemplary technology.
Figure 2:
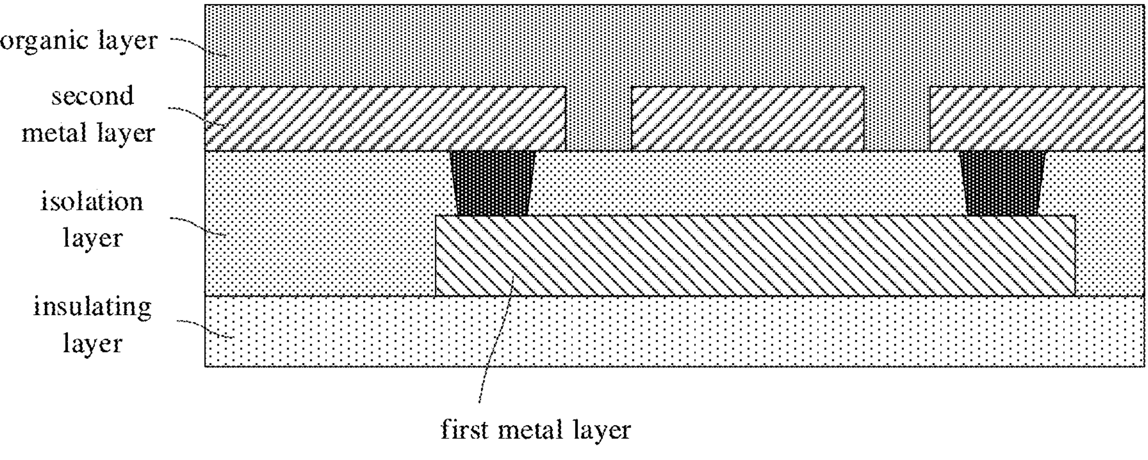
FIG. 2 is a schematic structural diagram of a TP layer in FIG. 1.

At present, OLED-based touch products usually adopt an external touch structure, in which, a TP structure is fabricated above an OLED display panel. FIG. 1 is a schematic structural diagram of a display panel in an exemplary technology. As shown in FIG. 1, a conductive layer is disposed on a pixel defining layer. The conductive unit may include a plurality of conductive units, and above each of the plurality of conductive units is provided with an eave layer. The TP layer is an independent structure and is arranged above an inorganic encapsulation layer. FIG. 2 is a schematic structural diagram of the TP layer in FIG. 1. As shown in FIG. 2, the TP layer may include: an insulating layer, a first metal layer, an isolation layer, a second metal layer, and an organic layer. Two metal layers are required to form Tx/Rx signal lines. The fabricating process requires at least three masking operations (including the masking operations corresponding to the two metal layers and the masking operations corresponding to the via hole between the two metal layers), which is expensive.

In view of this, embodiments of the present application provide a display panel, which aims at reducing the number of masking operations in the fabrication process of the TP structure and reducing the production cost.

The display panel provided by embodiments of the present application may include a metal layer (which may reuse the original metal layer, such as the conductive unit above the pixel defining layer, or may be a prepared metal layer) arranged between a pixel defining layer and a second inorganic encapsulation layer. The metal layer forms a plurality of first signal lines extending along a first direction and a plurality of second signal lines extending along a second direction. Each of the plurality of first signal lines includes a plurality of first sensing regions arranged at intervals, and metal lines in each of the plurality of first sensing regions are interconnected to form a first sensing electrode. Each of the plurality of second signal lines includes a plurality of second sensing regions arranged at intervals, and metal lines in each of the plurality of second sensing regions are interconnected to form a second sensing electrode.

Adjacent first sensing electrodes on each of the plurality of first signal lines are interconnected, and adjacent second sensing electrodes on each of the plurality of second signal lines are bridged through another metal layer (which may reuse the original metal layer, such as the anode unit, the conductive unit, and the like). By reusing the metal layers in the display panel (the metal layer between the pixel defining layer and the second inorganic encapsulation layer may be reused, and other metal layers may also be reused), the masking corresponding to the reused metal layer can be reduced during the fabrication of the TP structure, thereby reducing the production cost.

An included angle between the first direction and the second direction may be greater than 0° and smaller than or equal to 90°, which is not specifically limited in the present application.

The first signal line and the second signal line correspond to Tx and Rx signal lines, respectively. When the first signal line is the Tx signal line, the second signal line is the Rx signal line; and when the first signal line is the Rx signal line, the second signal line is the Tx signal line.

Figure 3:
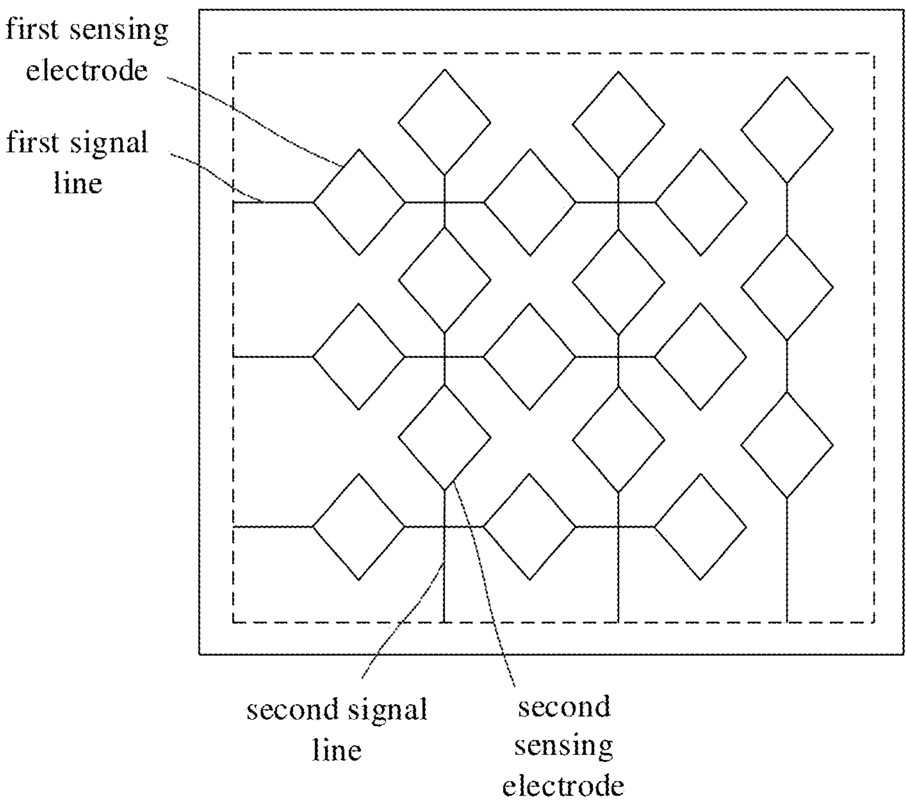
FIG. 3 is a schematic structural diagram of first signal lines and second signal lines provided by an embodiment of the present application.

FIG. 3 is a schematic structural diagram of first signal lines and second signal lines provided by an embodiment of the present application. As shown in FIG. 3, the first signal lines and the second signal lines are crossed to each other to form a reticulate structure. The first signal lines include multiple lines which are arranged parallel to each other, and the second signal lines include multiple lines which are arranged parallel to each other. Both the first sensing electrodes and the second sensing electrodes are diamond-shaped. The first sensing electrodes and the second sensing electrodes may also be in other shapes, such as rectangle, circle, triangle, and the like, which are not specifically limited in the present application.

The first signal lines and the second signal lines are used as signal lines of the TP structure, can be lapped at pin pads, and are time-divisionally multiplexed through verification status (VSS) signals.

Figure 4:
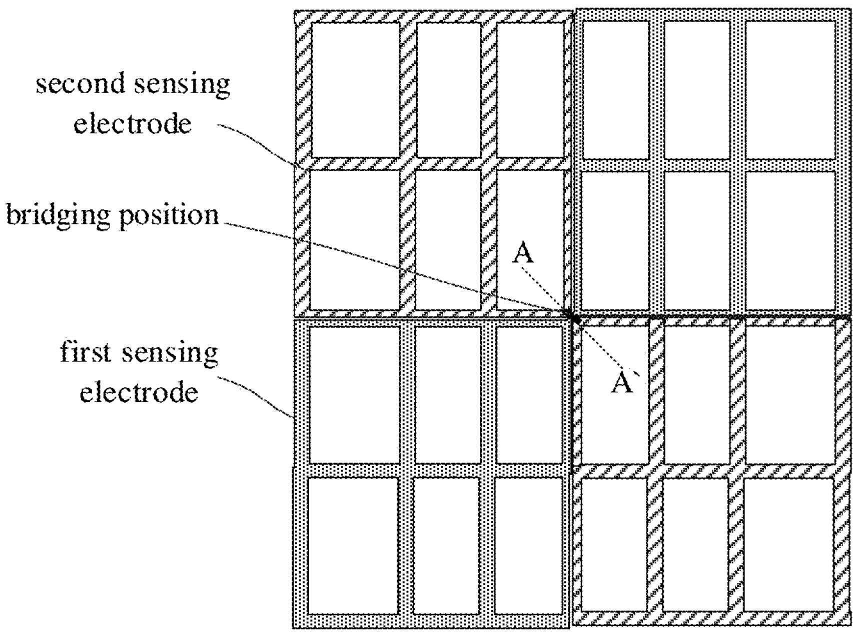
FIG. 4 is a schematic diagram of an intersection of the first signal line and the second signal line in FIG. 3.

FIG. 4 is a schematic diagram of an intersection of the first signal line and the second signal line in FIG. 3. As shown in FIG. 4, the metal lines in each first sensing electrode are interconnected (corresponding to multiple pixel areas), and the metal lines in each second sensing electrode are interconnected (corresponding to multiple pixel areas). Adjacent first sensing electrodes on each first signal line are interconnected, and adjacent second sensing electrodes on each second signal line are connected through metal bridges of other layers.

Figure 5:
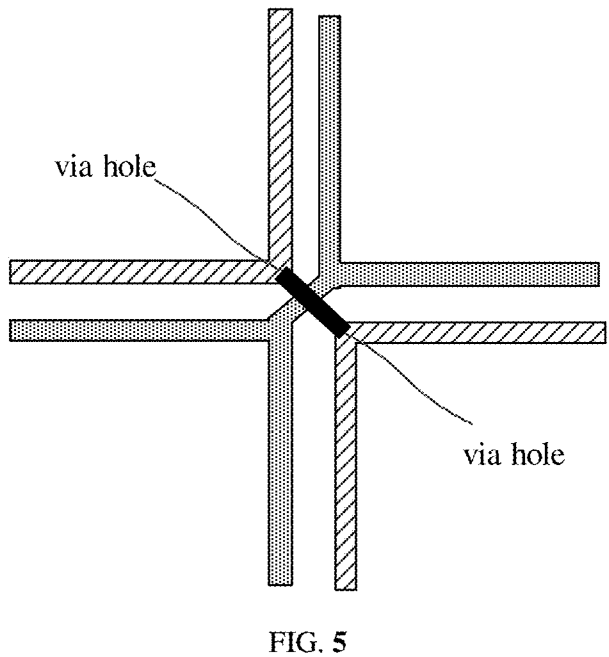
FIG. 5 is a schematic diagram of a bridging manner of a second sensing electrode provided by an embodiment of the present application.
Figure 6:
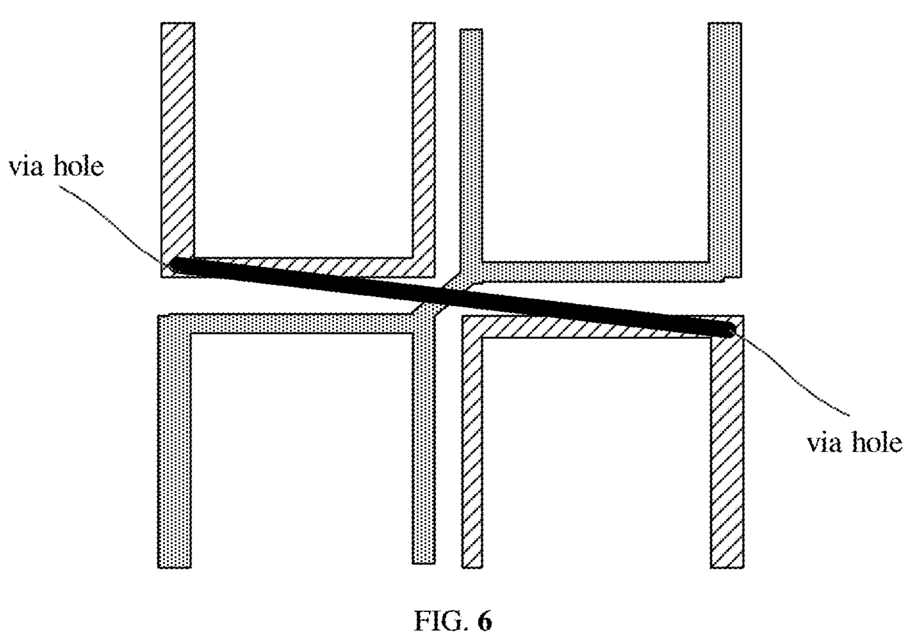
FIG. 6 is a schematic diagram of another bridging manner of a second sensing electrode provided by an embodiment of the present application.

When the adjacent second sensing electrodes on the second signal line are bridged, as shown in FIG. 5, a bridge hole can be drilled at diagonal corners where a distance between the two second sensing electrodes is closest, or as shown in FIG. 6, the bridging hole is drilled at a relatively wide position to reduce the technical difficulty of punching holes during fabrication.

Figures 7, 8:
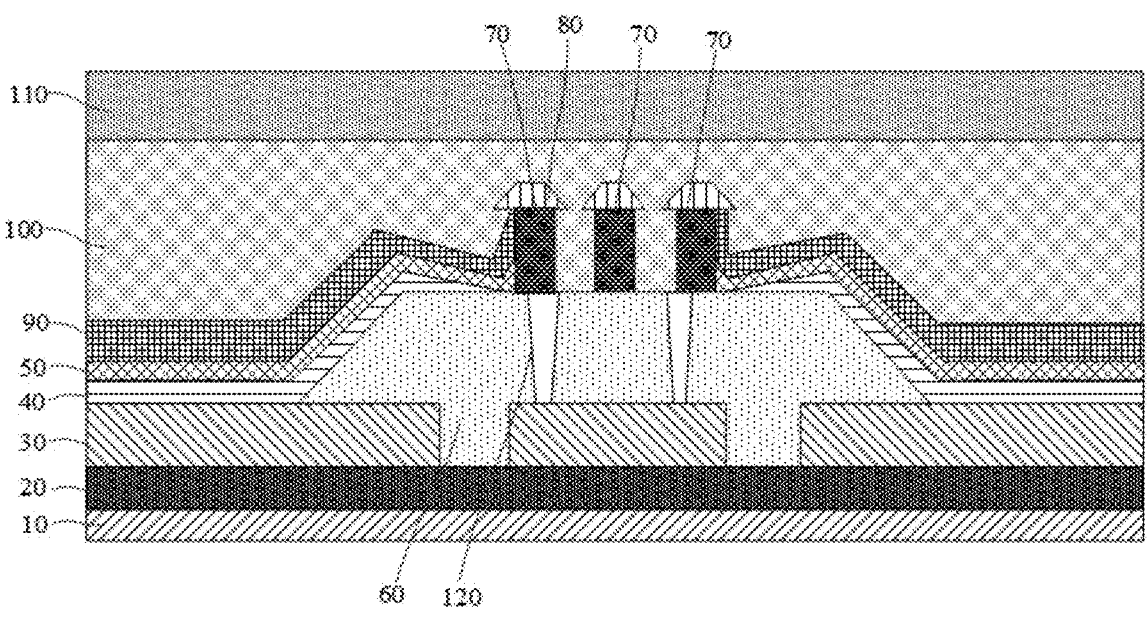
FIG. 7 is a cross sectional view of a display panel provided by an embodiment of the present application along a direction A-A' in FIG. 4.
FIG. 8 is a schematic flowchart of a method for fabricating the display panel in FIG. 7.

FIG. 7 is a cross sectional view of a display panel provided by an embodiment of the present application along the A-A' direction in FIG. 4. As shown in FIG. 7, the display panel provided by this embodiment may include the following layers from bottom to top: a substrate 10, a drive layer 20, an anode layer 30, a luminescent layer 40, a cathode layer 50, a first inorganic encapsulation layer 90, an organic buffer layer 100, and a second inorganic encapsulation layer 110.

The substrate 10 may be a rigid substrate or a flexible substrate, the material of the rigid substrate may be glass, and the material of the flexible substrate may be a polymer material, such as a polyimide.

The drive layer 20 is located above the substrate 10 and may include a plurality of thin film transistors (TFT) for driving the luminescent layer 40 to emit light.

The anode layer 30 is located above the drive layer 20, and the material of the anode layer 30 can be conductive metal oxide, such as indium tin oxide (ITO) and the like.

The anode layer 30 may include a plurality of anode units arranged at intervals, and a pixel defining layer 60 is arranged between adjacent anode units. The pixel defining unit can be made of an organic polyimide, or inorganic $SiN_x$, $SiO_x$, $SiO_xN_x$, or the like.

A conductive layer is arranged on the pixel defining layer 60, and the conductive layer includes a plurality of conductive units 70, and the conductive units 70 can be made of a material of copper, silver, and other metals.

On each of the plurality of conductive units 70 is disposed an eave layer 80, and the eave layer 80 is used to disconnect the cathode layer 50 from an encapsulation layer disposed above the eave layer 80, so that the encapsulation layer can well protect the cathode layer 50, so that the cathode layer 50 is prevented from being affected by an etchant during a subsequent pattern photolithography.

The luminescent layer 40 is covered on the anode layer 30 and the pixel defining layer 60, and the luminescent layer 40 may include luminescent materials for emitting various color lights such as red light, green light, and blue light.

The cathode layer 50 is covered on the luminescent layer 40, and the cathode layer 50 can be made of a metal material, such as aluminum (Al), gold (Au), silver (Ag), a magnesium (Mg)—Ag alloy, and the like.

The first inorganic encapsulation layer 90 is disposed above the cathode layer 50 and the eave layers 80, and the first inorganic encapsulation layer 90 may be made of a material including silicon nitride, silicon oxynitride, or a combination thereof.

The organic buffer layer 100 is disposed above the first inorganic encapsulation layer 90, and the organic buffer layer 100 is made of a transparent photoresist having a high refractive index, such as a polyimide photosensitive polymer and other materials.

The second inorganic encapsulation layer 110 is disposed above the organic buffer layer 100, and a material of the second inorganic encapsulation layer 110 is the same as that of the first inorganic encapsulation layer 90.

In this embodiment, a metal layer arranged between the pixel defining layer 60 and the second inorganic encapsulation layer 110 is the conductive layer. Among the three conductive units 70 above the pixel defining layer 60, the conductive unit 70 in the middle is the conductive unit 70 on a first signal line, and the conductive units 70 on two sides are conductive units 70 corresponding to two adjacent second sensing electrodes on a second signal line.

Regions (that is, corresponding regions in the pixel defining layer 60 arranged beneath two conductive units 70 arranged at two sides of the three conductive units 70 as shown in FIG. 7) in the pixel defining layer 60 corresponding to second sensing electrodes of each second signal line in the conductive layer are provided with via holes 120, and the adjacent second sensing electrodes on each second signal line formed in the conductive layer are bridged with the anode unit arranged beneath the pixel defining layer 60 through the via holes 120 in the pixel defining layer 60.

In this embodiment, the first signal line and the second signal line are formed by reusing the conductive layer, and the anode unit is reused to bridge the adjacent second sensing electrodes in each second signal line through the via holes 120 in the pixel defining layer 60, so as to form the TP structure. In this way, only one masking operation is required when drilling the pixel defining layer 60. Compared with the three operations of masking during the fabrication of the TP structure in the exemplary technology, two masking operations are omitted, thereby reducing the production costs. Moreover, in this technical solution, since the addition of new metal layer and insulating layer is not required, the thickness of the display panel can be reduced, making the display panel lighter and thinner.

It can be understood that the adjacent second sensing electrodes on each second signal line can also be bridged with other metal layers arranged beneath the pixel defining layer 60 (for example, the metal layer in the drive layer 20) through via holes 120 in the pixel defining layer 60. In this embodiment, it is taken another metal layer arranged beneath the pixel defining layer 60 being an anode layer 30 as an example for illustration.

FIG. 8 a schematic flowchart of a method for fabricating the display panel in FIG. 7. As shown in FIG. 8, the fabrication method may include steps S110-S140.

In step S110, a drive layer is formed on the substrate, an anode layer is formed on the drive layer, and a pixel defining layer is formed between adjacent anode units of the anode layer.

Specifically, the drive layer 20 can be formed on the substrate 10 firstly, and then the anode layer 30 can be formed on the drive layer 20 by a sputtering process. The anode layer 30 can include a plurality of anode units arranged at intervals, and then a pixel defining layer 60 is formed between among the anode units.

In step S120, via holes are formed in the pixel defining layer, conductive units are formed in the via holes and above the pixel defining layer, and an eave layer is formed on the conductive unit.

Specifically, via holes 120 can be formed in specific positions of the pixel defining layer 60, and a conductive layer (including a plurality of conductive units 70) can be formed in the via holes 120 and above the pixel defining layer 60, so that the adjacent second sensing electrodes in each second signal line formed in the conductive layer can be bridged by the anode unit through the via holes 120, in which, the specific positions in the pixel defining layer 60 where the via holes 120 are formed correspond to the adjacent second sensing electrodes in each second signal line formed in the conductive layer that need to be bridged.

After the conductive layer is formed, the eave layer 80 can be formed on the conductive units 70, and after the eave layer 80 is formed, the conductive units 70 arranged beneath the eave layer 80 can be further etched so that the edge of each conductive unit 70 is located within an edge of the eave layer 80.

The conductive layer formed by the plurality of conductive units 70 may be crossed to each other to form a reticulate structure.

In step S130, a luminescent layer is formed above the anode layer and the pixel defining layer, and a cathode layer is formed above the luminescent layer.

Specifically, the luminescent layer 40 and cathode layer 50 can be sequentially formed above the regions of the anode layer 30 and pixel defining layer 60 that are not covered by the conductive unit by using an evaporation process.

In step S140, a first inorganic encapsulation layer is formed on surfaces of the cathode layer, the plurality of conductive units, and the eave layer, and an organic buffer layer and a second inorganic encapsulation layer are sequentially formed above the first inorganic encapsulation layer.

Specifically, the first inorganic encapsulation layer 90 can be formed on the surfaces of the cathode layer 50, the conductive units 70, and the eave layers 80 by using processes such as plasma enhanced chemical vapor deposition, sputtering, and atomic layer deposition, then an organic buffer layer 100 can be formed on the first inorganic encapsulation layer 90 by using an inkjet printing method, after that, a second inorganic encapsulation layer 110 can be formed on the organic buffer layer 100 by using processes such as plasma enhanced chemical vapor deposition, sputtering, and atomic layer deposition.

Figure 9:
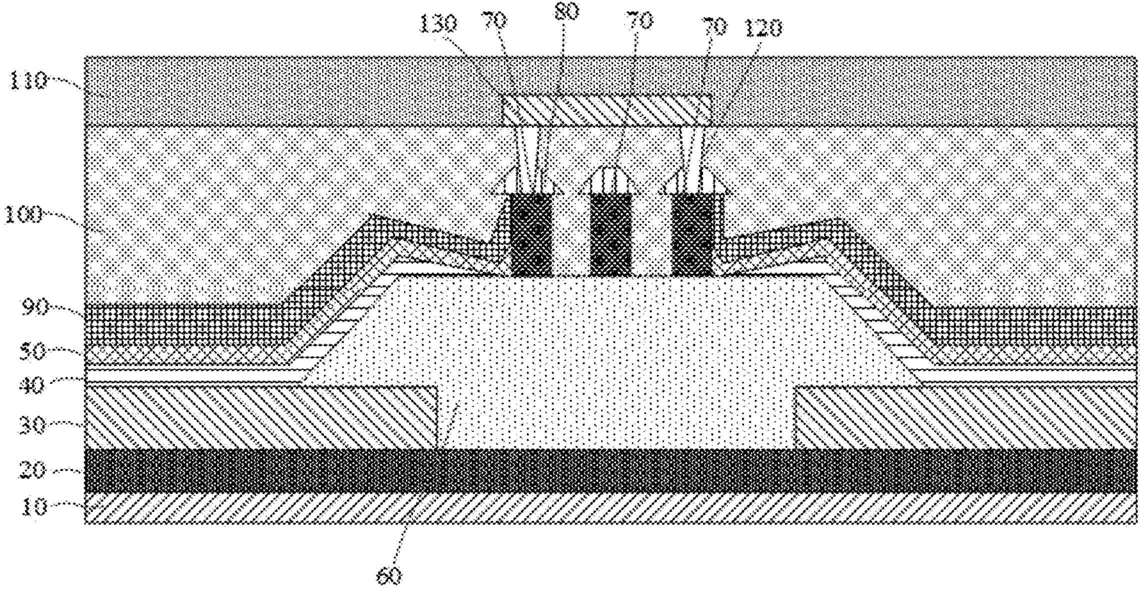
FIG. 9 is a cross sectional view of a display panel along the direction A-A' in FIG. 4 according to another embodiment of the present application.

FIG. 9 is a cross sectional view of a display panel along the direction A-A' in FIG. 4 according to another embodiment of the present application. As shown in FIG. 9, the display panel further includes: a first metal layer 130 arranged above the organic buffer layer 100. The organic buffer layer 100 and the eave layer 80 define therein via holes 120, and the metal layer arranged between the pixel defining layer 60 and the second inorganic encapsulation layer 110 is a conductive layer. The adjacent second sensing electrodes on each second signal line formed in the conductive layer are bridged with the first metal layer 130 through the via holes 120 in the organic buffer layer 100 and the eave layer 80.

The material of the first metal layer 130 can be copper, silver and other metals.

Among the three conductive units 70 above the pixel defining layer 60, the conductive unit 70 in the middle is the conductive unit 70 on a first signal line, and the conductive units 70 on two sides are conductive units 70 corresponding to two adjacent second sensing electrodes on a second signal line.

The first metal layer 130 is used to bridge the adjacent second sensing electrodes on each second signal line formed in the conductive layer. Regions (corresponding regions in the upper organic buffer layer 100 and the eave layer 80 arranged above two conductive units 70 which are arranged at two sides of the three conductive units 70 as shown in FIG. 9) of the organic buffer layer 100 and the eave layer 80 corresponding to second sensing electrodes of each second signal line in the conductive layer define therein via holes 120. The adjacent second sensing electrodes on each second signal line formed in the conductive layer are bridged with the first metal layer through the via holes 120 in the organic buffer layer 100 and the eve layer 80. While no via holes 120 is formed in the pixel defining layer 60.

In this embodiment, the first signal line and the second signal line are formed by reusing the conductive layer, and the newly added first metal layer 130 is bridged with the adjacent sensing electrodes in each second signal line through the via holes in the organic buffer layer 100 and the eave layer 80, so as to form the TP structure. In this way, only one masking operation is required when drilling organic buffer layer 100 and the eave layer 80. Compared with the three operations of masking during the fabrication of the TP structure in the exemplary technology, two masking operations are omitted, thereby reducing the production costs. Moreover, in this technical solution, since the addition of new metal layer and insulating layer is not required, the thickness of the display panel can be reduced, making the display panel lighter and thinner.

Figure 10:
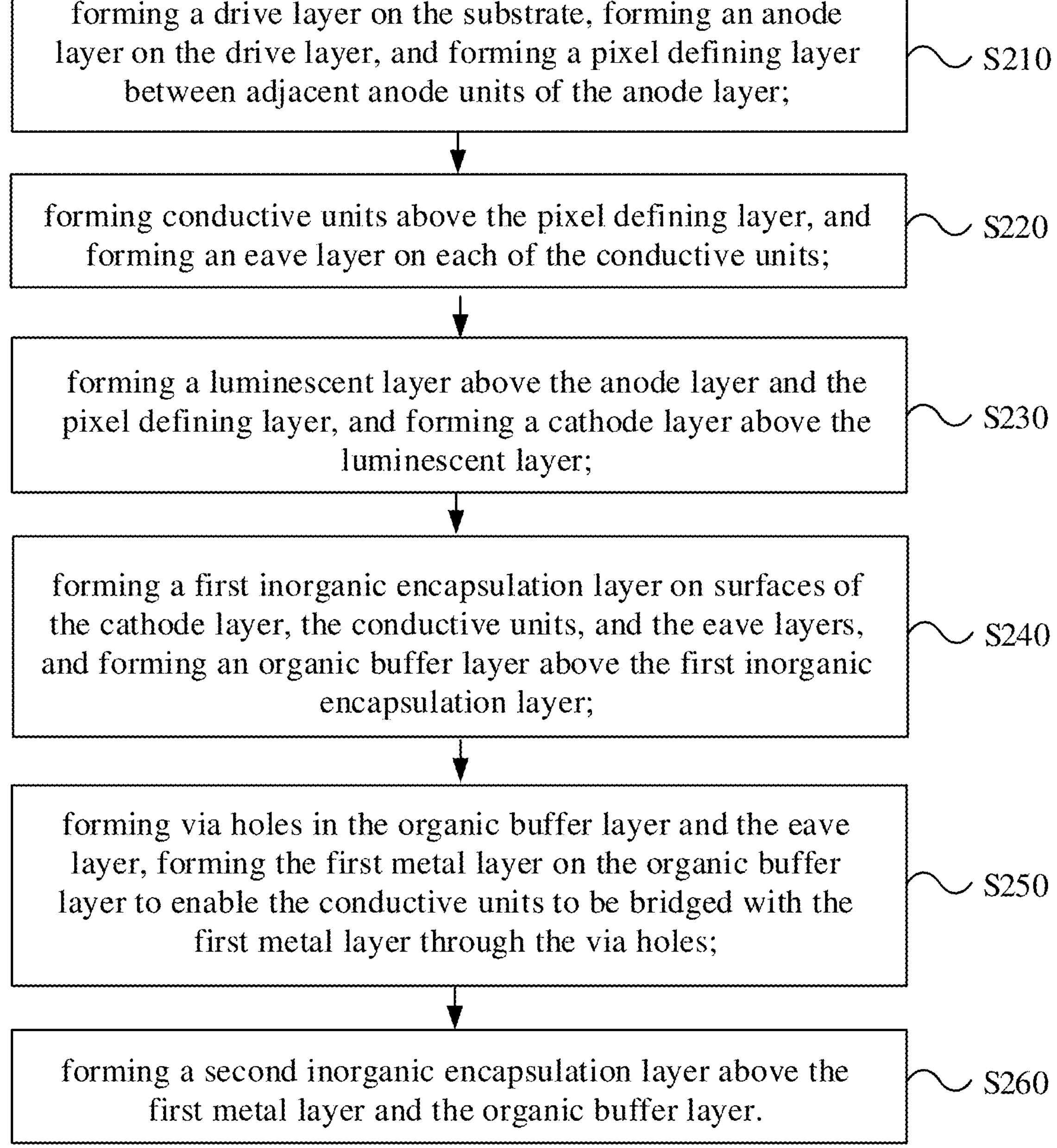
FIG. 10 is a schematic flow chart of a method for fabricating the display panel in FIG. 9.

FIG. 10 is a schematic flow chart of a method for fabricating the display panel in FIG. 9. As shown in FIG. 10, the fabrication method may include steps S210-S250.

S210, a drive layer is formed on the substrate, an anode layer is formed on the drive layer, and a pixel defining layer is formed between adjacent anode units of the anode layer.

Step S210 is similar to step S110 and will not be repeated here.

In step S220, conductive units are formed above the pixel defining layer, and an eave layer is formed on each of the conductive units.

Specifically, a plurality of conductive units 70 arranged at intervals may be formed above the pixel defining layer 60, and an eave layer 80 may be formed on each conductive unit 70. After the eave layer 80 is formed, the conductive unit 70 below the eave layer 80 can be further etched, so that the edge of the conductive unit 70 is located within the edge of the eave layer 80.

The conductive layer formed by the plurality of conductive units 70 may be crossed to each other to form a reticulate structure.

In step S230, a luminescent layer is formed above the anode layer and the pixel defining layer, and a cathode layer is formed above the luminescent layer.

Step S230 is similar to step S130 and will not be repeated here.

In step S240, a first inorganic encapsulation layer is formed on surfaces of the cathode layer, the conductive units, and the eave layers, and an organic buffer layer is formed above the first inorganic encapsulation layer.

Specifically, the first inorganic encapsulation layer 90 can be formed on the surfaces of the cathode layer 50, the conductive units 70, and the eave layers 80 by using processes such as plasma enhanced chemical vapor deposition, sputtering, and atomic layer deposition, and then an organic buffer layer 100 can be formed above the first inorganic encapsulation layer 90 by using an inkjet printing method.

In step S250, via holes are formed in the organic buffer layer and the eave layer, the first metal layer is formed on the organic buffer layer to enable the conductive units to be bridged with the first metal layer through the via holes.

Specifically, via holes 120 can be formed in specific positions of the organic buffer layer 100 and the eave layer 80, and a first metal layer 30 can be formed in the via holes 120 and above the organic buffer layer 100, so that the adjacent second sensing electrodes in each second signal line formed in the conductive layer can be bridged with the first metal layer 130 through the via holes 120, in which, the specific positions in the organic buffer layer 100 and the eave layer 80 where the via holes 120 are formed correspond to the adjacent second sensing electrodes in each second signal line formed in the conductive layer that need to be bridged.

In step S260, a second inorganic encapsulation layer is formed above the first metal layer and the organic buffer layer.

Specifically, the second inorganic encapsulation layer 110 can be formed on the organic buffer layer 100 by using processes such as plasma enhanced chemical vapor deposition, sputtering, and atomic layer deposition.

Figure 11:
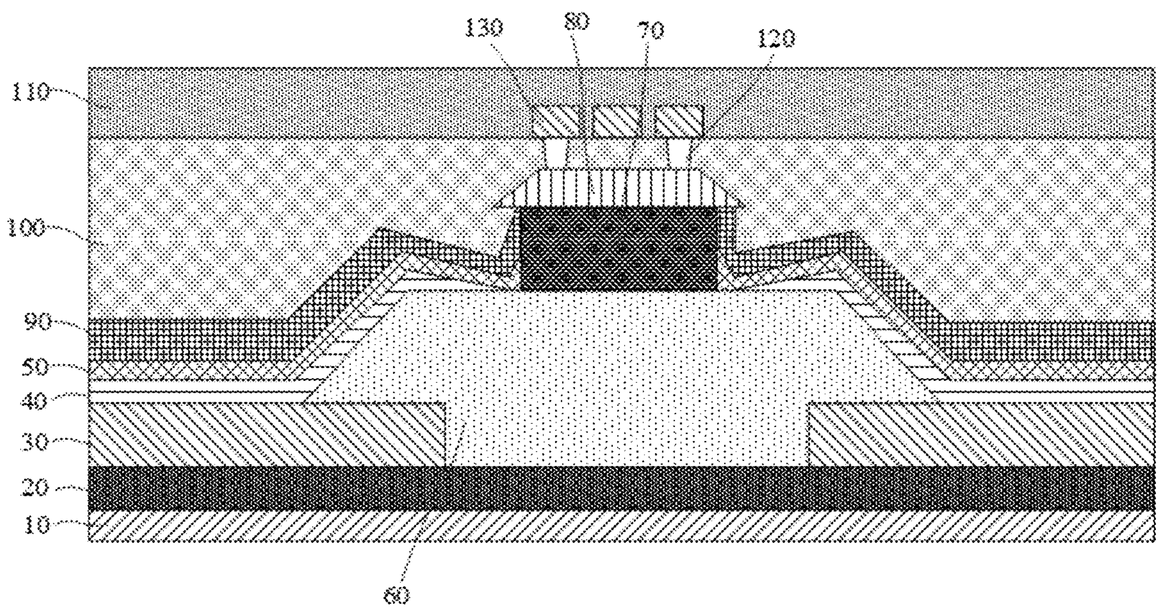
FIG. 11 is a cross sectional view of a display panel along the direction A-A' in FIG. 4 according to another embodiment of the present application.

FIG. 11 is a cross sectional view of a display panel along the direction A-A' in FIG. 4 according to another embodiment of the present application. As shown in FIG. 11, the display panel further includes: a first metal layer 130 disposed above the organic buffer layer 100, and the metal layer arranged between the pixel defining layer 60 and second inorganic encapsulation layer 110 is the first metal layer 130. The organic buffer layer 100 and the eave layer 80 define therein via holes 120, and adjacent second sensing electrodes on each second signal line formed in the first metal layer 130 are bridged with corresponding conductive units 70 through via holes in the organic buffer layer 100 and the eave layer 80.

The first metal layer 130 includes a plurality of metal lines. Among the three metal lines arranged above the organic buffer layer 100, a middle metal line is the metal line in the first signal line, and the metal lines at two sides are metal lines corresponding to adjacent two sensing electrodes in the second signal line.

The conductive unit 70 is used to bridge the adjacent second sensing electrodes on each second signal line formed in the first metal layer 130. Regions (corresponding regions in the upper organic buffer layer 100 and the eave layer 80 arranged beneath the two metal lines which are arranged at two sides of the three metal lines as shown in FIG. 11) of the organic buffer layer 100 and the eave layer 80 corresponding to second sensing electrodes of each second signal line in the first metal layer 130 define therein via holes 120. The adjacent second sensing electrodes on each second signal line formed in the first metal layer 130 are bridged with the conductive unit 70 through the via holes 120 in the organic buffer layer 100 and the eve layer 80. While no via holes 120 is formed in the pixel defining layer 60.

In this embodiment, the conductive layer is reused to bridge the adjacent sensing electrodes in each second signal line formed in the first metal layer 130 through the via holes in the organic buffer layer 100 and the eave layer 80, so as to form the TP structure. In this way, one masking operation is conducted during drilling organic buffer layer 100 and the eave layer 80, and another masking operation is conduced when forming the first metal layer 130. Compared with the three operations of masking during the fabrication of the TP structure in the exemplary technology, one masking operation is omitted, thereby reducing the production costs. Moreover, in this technical solution, since only one metal layer is newly added, compared with the five-layered structure in the exemplary technology, the present technical solution can reduce the thickness of the display panel, making the display panel lighter and thinner.

Figure 12:
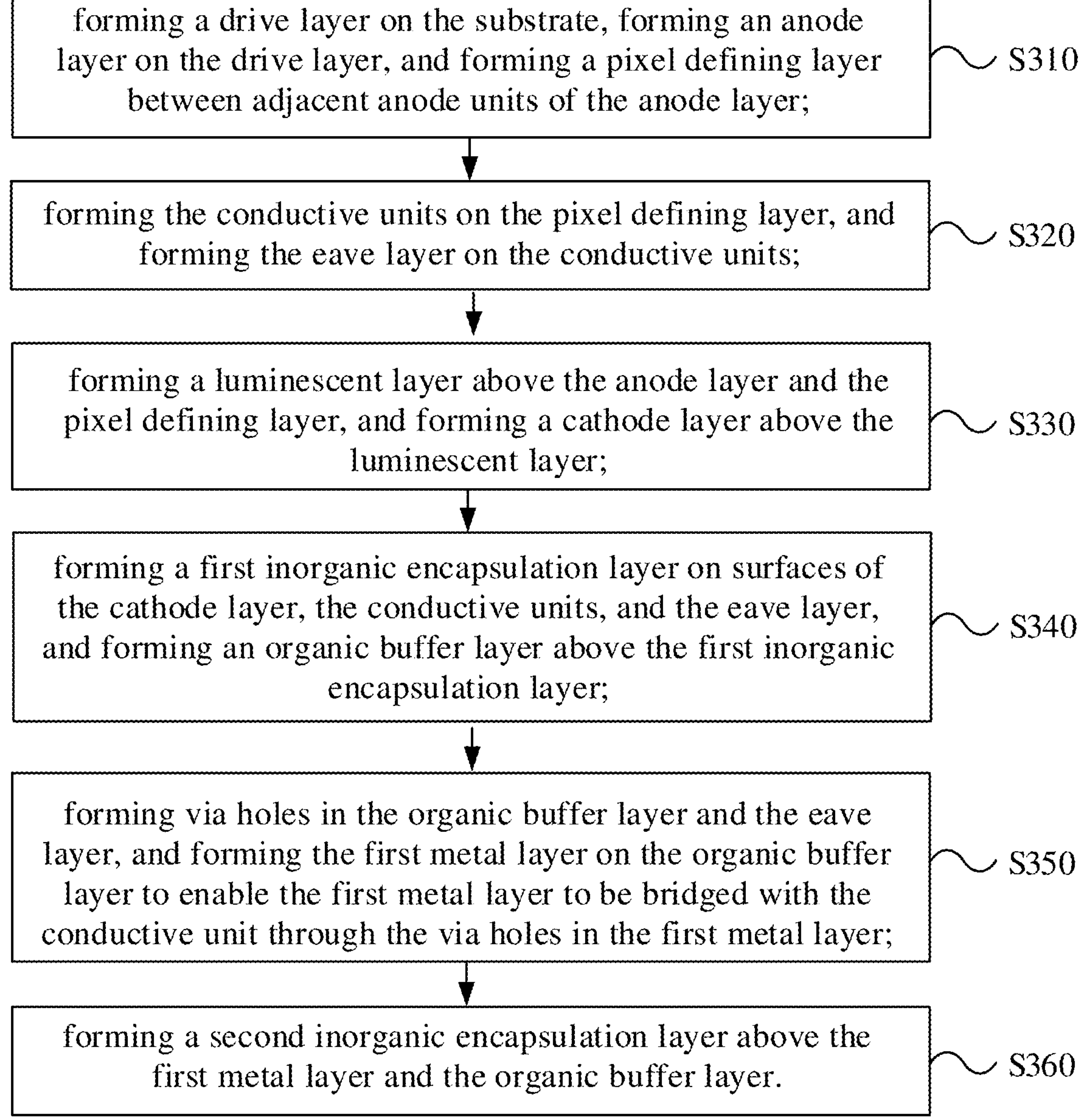
FIG. 12 is a schematic flow chart of a method for fabricating the display panel in FIG. 11.

FIG. 12 is a schematic flow chart of a method for fabricating the display panel in FIG. 11. As shown in FIG. 12, the fabrication method may include steps S310-S350.

In step S310, a drive layer is formed on the substrate, an anode layer is formed on the drive layer, and a pixel defining layer is formed between adjacent anode units of the anode layer.

In step S320, the conductive units are formed on the pixel defining layer, and the eave layer is formed on the conductive units.

In step S330, a luminescent layer is formed above the anode layer and the pixel defining layer, and a cathode layer is formed above the luminescent layer.

In step S340, a first inorganic encapsulation layer is formed on surfaces of the cathode layer, the conductive units, and the eave layer, and an organic buffer layer is formed above the first inorganic encapsulation layer.

Steps S310-S340 are similar to steps S210-S240, and will not be repeated here.

In step S350, via holes are formed in the organic buffer layer and the eave layer, and the first metal layer is formed on the organic buffer layer, to enable the first metal layer to be bridged with the conductive unit through the via holes in the first metal layer.

Specifically, via holes 120 can be formed in specific positions of the organic buffer layer 100 and the eave layer 80, and the first metal layer 30 can be formed in the via holes 120 and above the organic buffer layer 100, so that the adjacent second sensing electrodes in each second signal line formed in the first metal layer 130 can be bridged with the conductive unit 70 through the via holes 120, in which, the specific positions in the organic buffer layer 100 and the eave layer 80 where the via holes 120 are formed correspond to the adjacent second sensing electrodes in each second signal line formed in the first metal layer 130 that need to be bridged.

The first metal layer 130 may be crossed to each other to form a reticulate structure.

In step S360, a second inorganic encapsulation layer is formed above the first metal layer and the organic buffer layer.

Step S360 is similar to step S260 and will not be repeated here.

The technical solution provided by the embodiment of the present application includes: the substrate, the drive layer, the anode layer, the luminescent layer, the cathode layer, the first inorganic encapsulation layer, the organic buffer layer, and the second inorganic encapsulation layer arranged from bottom to top. The anode layer includes the plurality of anode units arranged at intervals. the pixel defining layer is arranged between adjacent anode units. The metal layer is arranged between the pixel defining layer and the second inorganic encapsulation layer. The metal layer forms the plurality of first signal lines extending along the first direction and the plurality of second signal lines extending along the second direction. Each of the plurality of first signal lines includes the plurality of first sensing regions arranged at intervals; and metal lines in each of the plurality of first sensing regions are interconnected to form the first sensing electrode. Each of the plurality of second signal lines includes the plurality of second sensing regions arranged at intervals; and metal lines in each of the plurality of second sensing regions are interconnected to form the second sensing electrode. Adjacent first sensing electrodes on each of the plurality of first signal lines are interconnected, and adjacent second sensing electrodes on each of the plurality of second signal lines are bridged through another metal layer. In the above technical solution, by reusing the metal layers in the display panel (the metal layer between the pixel defining layer and the second inorganic encapsulation layer may be reused, and other metal layers may also be reused), the fabrication of the TP structure of the display panel is achieved. In this way, the masking operation corresponding to the reused metal layer can be reduced during the fabrication of the TP structure, thereby reducing the production cost.

In the above-mentioned embodiments, the descriptions of the embodiments have their own emphases, and for parts that are not detailed or recorded in a certain embodiment, relevant descriptions of other embodiments can be referred to.

In addition, the size ratio relationship among the various components in the drawings is only schematic, which does not reflect the actual size ratio relationship between the various components.

In the description of the present application, orientations or positional relationships indicated by the terms "central", "longitudinal", "transverse", "upper", "lower", "front", "rear", "left", "right", "vertical" "horizontal", "top", "bottom", "inner", "outer", and the like are based on the orientations or positional relationships shown in the drawings, and are only for the convenience of describing the present application and simplifying the description, rather than indicating or implying that a referenced device or element must have a particular orientation, or be constructed and operated in a particular orientation, and should therefore not be construed as limiting the present application.

In the description of the present application, it should be noted that unless otherwise specified and limited, the terms "installation" and "connection" should be understood in a broad sense, for example, it can be a fixed connection or a detachable connection, or an integral connection; it can be mechanically connected or electrically connected; it can be directly connected or indirectly connected through an intermediary, and it can be the internal communication of two components. Those skills in the art can understand the specific meanings of the above terms in the present application based on specific situations.

It should be understood that when used in this specification and the appended claims, the term "comprising" indicates the presence of described features, integers, steps, operations, elements, and/or components, but does not exclude existence or addition of one or more other features, wholes, steps, operations, elements, components and/or collections thereof.

In the description of the present application, unless otherwise specified, "/" means that the objects associated with each other are an "or" relationship, for example, A/B can mean A or B; "and/or" in the present application is only an association relationship describing associated objects, which means that there can be three kinds of relationships, for example, A and/or B, which can mean: A exists alone, A and B exist at the same time, and B exists alone, in which, A and B can be singular or plural.

In the description of the present application, unless otherwise specified, "plurality" means two or more than two. "At least one of the following" or similar expressions refer to any combination of these items, including any combination of single items or plural items. For example, at least one of a, b, or c can represent: a, b, c, a-b, a-c, b-c, or a-b-c, in which, a, b, c can be singular or plural.

In addition, in the description of the specification and the appended claims of the present application, the terms "first", "second", "third", and the like are used to distinguish similar objects, and not necessarily used to describe a specific order or sequence order. It is to be understood that the terms so used are interchangeable under appropriate circumstances such that the embodiments described herein can be practiced in sequences other than those illustrated or described herein.

Reference to "an embodiment" or "some embodiments" or the like in the specification of the present application means that a particular feature, structure, or characteristic described in connection with such embodiment is included in one or more embodiments of the present application. Thus, appearances of the phrases "in an embodiment", "in some embodiments", "in other embodiments", "in still other embodiments", and the like in various places in this specification are not necessarily all refer to the same embodiment, but mean "one or more but not all embodiments", unless specifically stated otherwise.

Finally, it should be noted that: the above embodiments are only used to illustrate the technical solutions of the present application, rather than making limitations on the technical solutions; although the application has been described in detail with reference to the foregoing embodiments, those skills in the art should understand that: it is still possible to modify the technical solutions described in the foregoing embodiments, or perform equivalent replacements for some or all of the technical features; and these modifications or replacements do not make the essence of the corresponding technical solutions deviate from the scope of technical solutions of the various embodiments of the present application.

What is claimed is:

1. A display panel, comprising, from bottom to top: a substrate, a drive layer, an anode layer, a luminescent layer, a cathode layer, a first inorganic encapsulation layer, an organic buffer layer, and a second inorganic encapsulation layer;

wherein the anode layer comprises a plurality of anode units arranged at intervals, a pixel defining layer is arranged between adjacent anode units, and a conductive layer is arranged on the pixel defining layer;

a metal layer is arranged between the pixel defining layer and the second inorganic encapsulation layer, and a plurality of first signal lines extending along a first direction and a plurality of second signal lines extending along a second direction are formed on the metal layer; each of the plurality of first signal lines comprises a plurality of first sensing regions arranged at intervals, and metal lines in each of the plurality of the first sensing regions are interconnected to form a first sensing electrode; each of the plurality of second signal lines comprises a plurality of second sensing regions arranged at intervals, and metal lines in each of the plurality of second sensing regions are interconnected to form a second sensing electrode;

adjacent first sensing electrodes on each of the plurality of first signal lines are interconnected, and adjacent second sensing electrodes on each of the plurality of second signal lines are bridged through another metal layer;

the metal layer is the conductive layer, and the another metal layer is a first metal layer arranged above the organic buffer layer or a metal layer arranged beneath the pixel defining layer; or alternatively, the metal layer is the first metal layer, and the another metal layer is the conductive layer;

the conductive layer comprises a plurality of conductive units, and on each of the plurality of conductive units is disposed an eave layer; and the metal layer comprises the conductive layer; and adjacent second sensing electrodes on each of the plurality of second signal lines are bridged with the first metal layer through via holes formed in the organic buffer layer and the eave layer.

2. The display panel according to claim 1, wherein adjacent second sensing electrodes on each of the plurality of second signal lines are bridged with a metal layer arranged beneath the pixel defining layer through via holes formed in the pixel defining layer.

3. The display panel according to claim 2, wherein adjacent second sensing electrodes on each of the plurality of second signal lines are bridged with corresponding anode units through via holes formed in the pixel defining layer.

4. The display panel according to claim 1, wherein the conductive layer comprises a plurality of conductive units, and, on each of the plurality of conductive units, an eave layer is disposed; and the metal layer comprises the first metal layer, and adjacent second sensing electrodes on each of the plurality of second signal lines are bridged with corresponding conductive units through via holes formed in the organic buffer layer and the eave layer.

5. The display panel according to claim 1, wherein the plurality of first signal lines and the plurality of second signal lines are crossed to form a reticulate structure.

6. The display panel according to claim 1, wherein the plurality of first signal lines and the plurality of second signal lines are crossed to form a reticulate structure.

7. The display panel according to claim 4, wherein the plurality of first signal lines and the plurality of second signal lines are crossed to form a reticulate structure.

8. A method for fabricating the display panel according to claim 1, the method comprising:

forming the drive layer on the substrate;

forming an anode layer on the drive layer, wherein the anode layer comprises a plurality of anode units arranged at intervals;

forming the pixel defining layer between adjacent anode units, forming the plurality of conductive units on the pixel defining layer, and forming an eave layer on each of the plurality of the conductive unit;

forming the luminescent layer on surfaces of the anode layer and the pixel defining layer, and forming the cathode layer on the luminescent layer;

forming the first inorganic encapsulation layer on surfaces of the cathode layer, the plurality of conductive units, and the eave layer; and forming the organic buffer layer above the first inorganic encapsulation layer, and forming the second inorganic encapsulation layer above the organic buffer layer.

9. The method according to claim 8, wherein after forming the pixel defining layer between the adjacent anode units and before forming the eave layer each of the plurality of conductive units, the method further comprises:

forming via holes in the pixel defining layer, to enable the conductive units to bridge with the corresponding anode units through the via holes.

10. The method according to claim 8, wherein after forming the organic buffer layer above the first inorganic encapsulation layer and before forming the second inorganic encapsulation layer above the organic buffer layer, the method further comprises:

forming via holes in the organic buffer layer and the eave layer, forming the first metal layer above the organic buffer layer, and bridging the conductive units with the first metal layer through the via holes.

11. The method according to claim 8, wherein the conductive layer comprises a plurality of conductive units, and an eave layer is disposed on each of the plurality of conductive units; and the metal layer comprises the conductive layer.

12. The method according to claim 11, wherein adjacent second sensing electrodes on each of the plurality of second signal lines are bridged with a metal layer arranged beneath the pixel defining layer through via holes formed in the pixel defining layer.

13. The method according to claim 12, wherein adjacent second sensing electrodes on each of the plurality of second signal lines are bridged with corresponding anode units through via holes formed in the pixel defining layer.

14. The method according to claim 11, wherein adjacent second sensing electrodes on each of the plurality of second signal lines are bridged with the first metal layer through via holes formed in the organic buffer layer and the eave layer.

15. The method according to claim 8, wherein the conductive layer comprises a plurality of conductive units, and an eave layer is disposed on each of the plurality of conductive units; and the metal layer comprises the first metal layer, and adjacent second sensing electrodes on each of the plurality of second signal lines are bridged with corresponding conductive units through via holes formed in the organic buffer layer and the eave layer.

16. The method according to claim 8, wherein the plurality of first signal lines and the plurality of second signal lines are crossed to form a reticulate structure.

17. The method according to claim 13, wherein the plurality of first signal lines and the plurality of second signal lines are crossed to form a reticulate structure.

18. The method according to claim 15, wherein the plurality of first signal lines and the plurality of second signal lines are crossed to form a reticulate structure.

* * * * *